United States Patent
Tane

(10) Patent No.: US 12,137,581 B2
(45) Date of Patent: Nov. 5, 2024

(54) ORGANIC ELECTROLUMINESCENCE DISPLAY

(71) Applicant: DENSO CORPORATION, Kariya (JP)

(72) Inventor: Seigo Tane, Kariya (JP)

(73) Assignee: DENSO CORPORATION, Kariya (JP)

( * ) Notice: Subject to any disclaimer, the term of this patent is extended or adjusted under 35 U.S.C. 154(b) by 485 days.

(21) Appl. No.: 17/580,361

(22) Filed: Jan. 20, 2022

(65) Prior Publication Data

US 2022/0149336 A1 May 12, 2022

Related U.S. Application Data

(63) Continuation of application No. PCT/JP2020/028522, filed on Jul. 22, 2020.

(30) Foreign Application Priority Data

Jul. 26, 2019 (JP) .................. 2019-138001

(51) Int. Cl.
H10K 50/86 (2023.01)
(52) U.S. Cl.
CPC .................. H10K 50/865 (2023.02)
(58) Field of Classification Search
None
See application file for complete search history.

(56) References Cited

U.S. PATENT DOCUMENTS

| | | | |
|---|---|---|---|
| 2011/0228401 A1 | 9/2011 | Fukushima et al. | |
| 2019/0079236 A1* | 3/2019 | Hung | H10K 50/841 |
| 2021/0181392 A1* | 6/2021 | Lesuffleur | C03C 17/3405 |
| 2022/0176821 A1* | 6/2022 | Hart | G02F 1/133308 |
| 2022/0402801 A1* | 12/2022 | Benjamin | C03B 23/0357 |
| 2023/0200199 A1* | 6/2023 | Badar | B60R 11/0235 |
| | | | 257/40 |
| 2024/0165919 A1* | 5/2024 | Alonzo | G02F 1/133331 |

FOREIGN PATENT DOCUMENTS

| | | |
|---|---|---|
| JP | 3145932 U | 10/2008 |
| JP | 2009003151 A | 1/2009 |
| WO | WO-2010055564 A1 | 5/2010 |
| WO | WO-2012002506 A1 | 1/2012 |

* cited by examiner

*Primary Examiner* — Benjamin P Sandvik
(74) *Attorney, Agent, or Firm* — Harness, Dickey & Pierce, P.L.C.

(57) ABSTRACT

One aspect of the present disclosure is an organic EL display, which includes a large number of light emitting elements that emit light when an organic substance is energized. The organic EL display has a display unit configured to display an image by emitting light generated by a large number of light emitting elements from a display surface, and a peripheral member arranged on the same surface as the display surface so as to surround the periphery of the display unit and made of a material having a light absorption rate that matches the light absorption rate of the display unit when no light is emitted.

6 Claims, 3 Drawing Sheets

ORGANIC ELECTROLUMINESCENCE DISPLAY

CROSS REFERENCE TO RELATED APPLICATIONS

This application is a continuation application of International Patent Application No. PCT/JP2020/028522 filed on Jul. 22, 2020, which designated the U.S. and based on and claims the benefits of priority of Japanese Patent Application No. 2019-138001 filed on Jul. 26, 2019. The entire disclosure of all of the above applications is incorporated herein by reference.

TECHNICAL FIELD

The present disclosure relates to an organic electroluminescence display configured to be capable of displaying an image.

BACKGROUND

An organic electroluminescence display is arranged in a vehicle. Hereinafter, electroluminescence is referred to as "EL".

SUMMARY

One aspect of the present disclosure is to enable the organic EL display when it does not emit light to be assimilated and arranged in a surrounding interior or the like.

One aspect of the present disclosure is an organic EL display, which includes a display unit and a peripheral member. The display unit includes a large number of light emitting elements that emit light when electric current is passed through an organic substance, and is configured to display an image by emitting light generated by the large number of light emitting elements from the display surface. The peripheral member is arranged on the same surface as the display surface so as to surround the display unit, and is composed of a material having a light absorption rate that matches the light absorption rate of the display unit when no light is emitted.

DETAILED DESCRIPTION

In an assumable example, a configuration in which an organic electroluminescence display is arranged in a vehicle is disclosed. Hereinafter, electroluminescence is referred to as "EL".

There is a demand that an existence of a non-light emitting organic EL display is concealed from a surrounding interior and the like so that the non-light emitting organic EL displays assimilated and arranged in the surrounding interior and the like. However, as a result of detailed study by the discloser, even if an attempt is made to assimilate the organic EL display into the surrounding interior or the like, a problem has been found in which an edge of the organic EL display is easily conspicuous and it is difficult to conceal the organic EL display.

One aspect of the present disclosure is to enable the organic EL display when it does not emit light to be assimilated and arranged in the surrounding interior or the like.

One aspect of the present disclosure is an organic EL display, which includes a display unit and a peripheral member. The display unit includes a large number of light emitting elements that emit light when electric current is passed through an organic substance, and is configured to display an image by emitting light generated by the large number of light emitting elements from the display surface. The peripheral member is arranged on the same surface as the display surface so as to surround the display unit, and is composed of a material having a light absorption rate that matches the light absorption rate of the display unit when no light is emitted.

According to such a configuration, since the peripheral member is arranged on the same surface as the display surface, it is possible to suppress diffuse reflection of external light near the boundary between the display unit and the peripheral member. Further, since the light absorption rate of the display unit and the light absorption rate of the peripheral member match near the boundary between the display unit and the peripheral member, this boundary can be made difficult to see. Therefore, the display unit at the time of non-light emission can be easily assimilated into the peripheral member.

Here, the term "on the same surface" in the description of "on the same surface as the display surface" is not limited to the same surface in a strict sense, but is a concept including substantially the same surface. It does not have to be exactly on the same plane as long as the same effect as described above can be obtained. Further, the term "match" in the description of "matching the light absorption rate in the display unit when no light is emitted" is not limited to matching in a strict sense, but is a concept including substantially matching. It does not have to be exactly the same as long as the same effect as described above can be obtained.

Embodiments of the present disclosure will be described below with reference to the drawings.

1. Embodiment

1-1. Configuration

Figure 1:
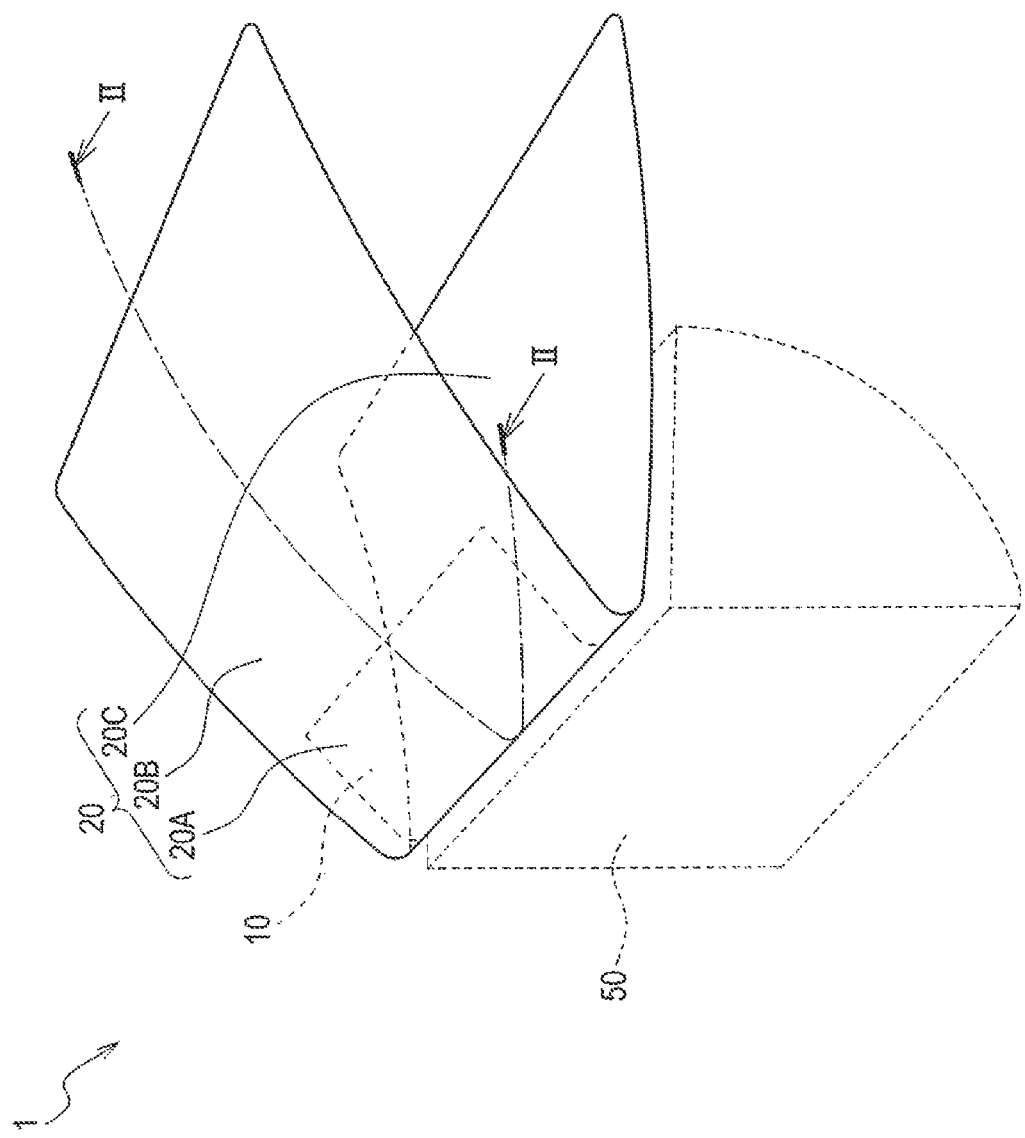
FIG. 1 is an external perspective view of an organic EL display.

An organic EL display 1 shown in FIG. 1 is arranged in a vehicle interior that can be visually recognized by an occupant in a vehicle such as a passenger car. The organic EL display 1 includes a display unit 10 and an interior member 20. Further, a storage portion 50 may be provided around the organic EL display 1.

The display unit 10 includes a large number of light emitting elements that emit light when electric current is passed through an organic substance. The term "large number" indicates that a plurality of light emitting elements are arranged vertically and horizontally, and in particular, in the present embodiment, it means that the light emitting elements are arranged side by side in a matrix.

A large number of light emitting elements are arranged along the display surface, and the display unit 10 is configured to display an image by emitting light generated by the large number of light emitting elements from the display surface. Here, the display unit 10 is configured to wrap a large number of light emitting elements with a material such as a bendable film-like resin, and the display unit 10 is arranged along a curved surface shape of an interior member 20 by this configuration. A display surface of the display unit 10 is formed as a curved surface along the interior member 20.

Figure 2:
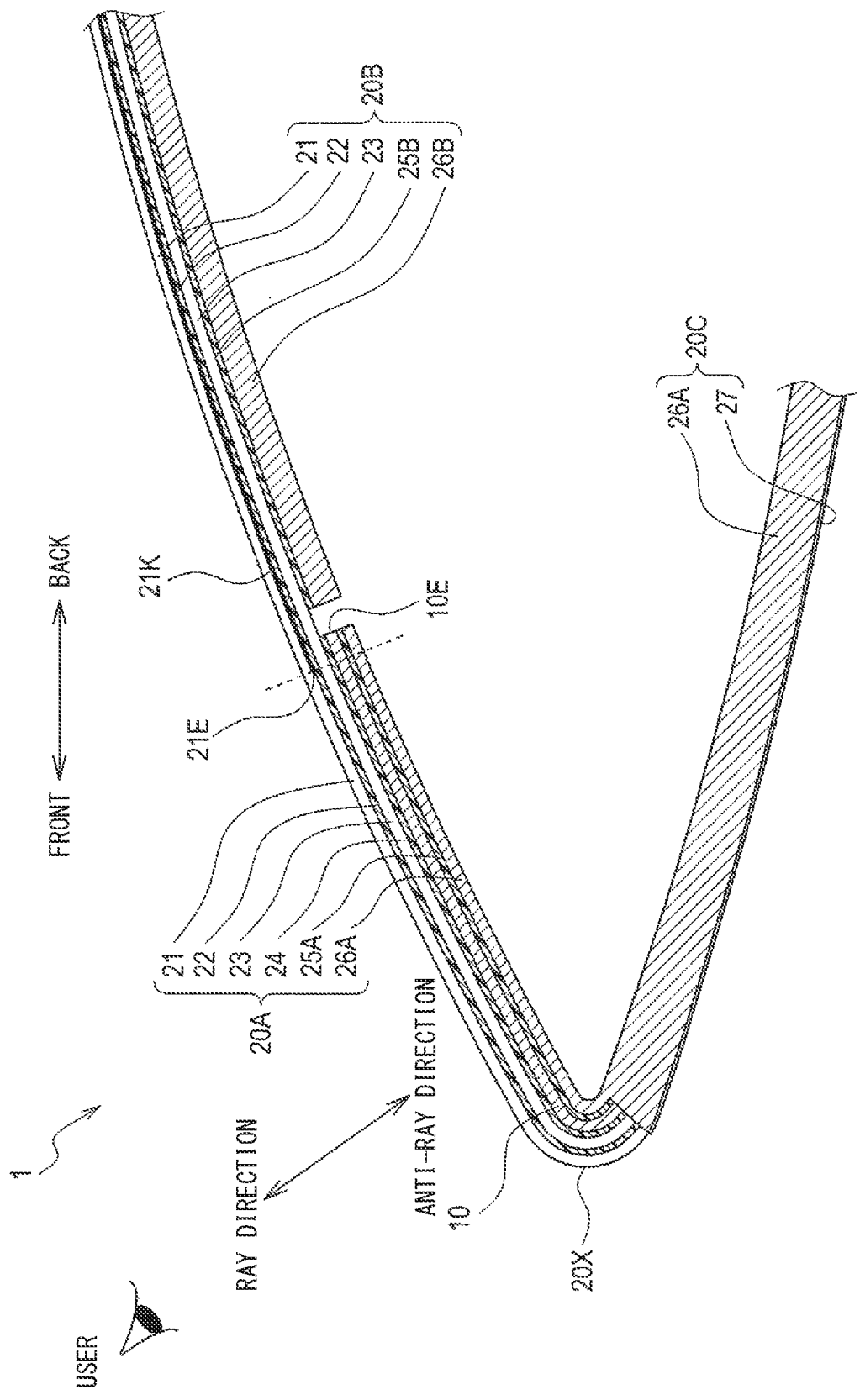
FIG. 2 is a cross-sectional view taken along the line II-II in FIG. 1.

The interior member 20 constitutes a part of the interior in a vehicle interior. In other words, the interior member 20 constitutes an inner surface of the vehicle interior or a part of the interior decoration. As shown in FIGS. 1 and 2, the display unit 10 is assembled inside the interior member 20. The interior member 20 is configured to be inclined so that a position of an upper surface portion approaches the ground from a back side to a front side when viewed from the user's position. In FIG. 2, the back side is a right side of the paper surface, and the front side is a left side of the paper surface.

Further, the interior member 20 includes a bent portion 20X that bends downward on the front side, and is configured to be inclined so that the position of a lower surface portion approaches the ground from the bent portion 20X toward the back side. The display unit 10 is arranged near the position of the bent portion 20X at the lower end thereof.

The interior member 20 has a different cross-sectional structure depending on the portion. As for the interior member 20, as shown in FIGS. 1 and 2, the configuration of the interior member 20 at the portion where the display unit 10 is present is defined as a display portion structure 20A. Further, the configuration of the interior member 20 at a portion around the display unit 10 that is substantially on the same surface as the surface on which the display unit 10 is arranged and is on the upper surface portion side with respect to the bent portion 20X is defined as a peripheral portion structure 20B. Further, the structure of the interior member 20 on the lower portion side of the bent portion 20X of the display unit 10 is defined as a lower portion structure 20C. However, the term "on the same surface" is a concept that includes substantially the same surface, and also includes the same surface or the same curved surface.

In the following description, the terms as a ray direction and an anti-ray direction will be used. As shown in FIG. 2, the ray direction is the direction in which light is emitted from the display surface. Therefore, covering from the ray direction side means covering from the user side rather than the display unit 10. Further, the direction opposite to the ray direction is defined as the anti-ray direction.

In the display portion structure 20A, as shown in FIG. 2, a covering member 21, a first adhesive member 22, a base material 23, a second adhesive member 24, the display unit 10, a third adhesive member 25A, a third adhesive member 25A, and a first case portion 26A are laminated in this order from the ray direction side.

The covering member 21 is a member that serves as a skeleton of the interior, and seamlessly covers at least a part of the first case portion 26A and the second case portion 26B, which will be described later, and at this time, the covering member 21 seamlessly covers the entire surface of the display unit 10 is seamlessly covered from the ray direction side.

The covering member 21 is made of, for example, a translucent thermoplastic or the like, and is configured to transmit light emitted from the display unit 10. However, the covering member 21 may be made of any transparent or translucent material. For the covering member 21, for example, Hytrel (registered trademark) or the like can be adopted.

The base material 23 has a rigidity higher than a rigidity against bending of the display unit 10. The base material 23 is laminated on the anti-ray direction side of the covering member 21 without a gap via the first adhesive member 22. The base material 23 is made of a colorless and transparent material such as acrylic. The base material 23 is not limited to a colorless and transparent material, and may be made of any material such as translucent as long as it can transmit light emitted from the display unit 10.

The display unit 10 is laminated on the anti-ray direction side of the base material 23 without a gap via the second adhesive member 24. Then, the first case portion 26A is laminated on the anti-ray direction side of the display unit 10 without a gap via the third adhesive member 25A. The first case portion 26A is made of a metal material having a higher rigidity than that of the base material 23. For the first case portion 26A, for example, an aluminum alloy or the like is adopted.

The first case portion 26A is bent at the bent portion 20X to form the skeleton of the display portion structure 20A and the lower portion structure 20C.

An adhesive that becomes colorless and transparent at the time of curing can be adopted for the first adhesive member 22, the second adhesive member 24, and the third adhesive member 25A. For these adhesive members 22, 24, 25A, for example, OCR (Optically Clear Resin), which is an optical resin that is cured by ultraviolet rays, or OCA (Optical Clear Adhesive), which is an optical sheet, can be adopted.

In the peripheral portion structure 20B, the covering member 21, the first adhesive member 22, the base material 23, the third adhesive member 25B, and the second case portion 26B are laminated in this order from the ray direction side.

Figure 3:
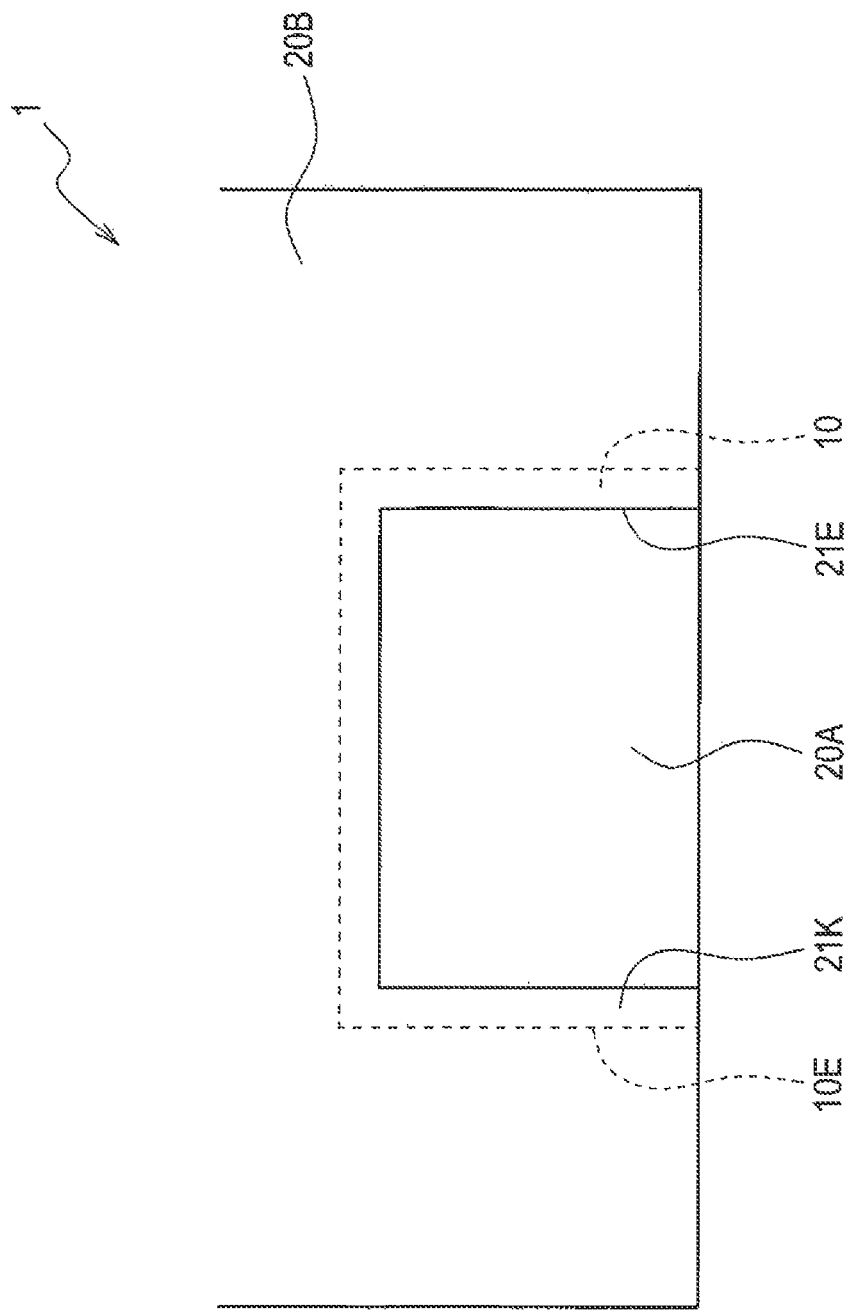
FIG. 3 is a front view of the organic EL display.

The covering member 21 is integrated with the configuration of the display portion structure 20A, and has the same configuration thereof. However, in the peripheral portion structure 20B, a colored layer 21K is provided on the anti-ray direction side of the covering member 21. The colored layer 21K corresponds to the peripheral member in the present disclosure. The colored layer 21K is arranged on substantially the same surface as the display surface of the display unit 10 so as to surround the periphery of the display unit 10. As shown in FIG. 3, the colored layer 21K of the present embodiment is arranged so as to surround three sides of the periphery of the display unit 10 except a lower side.

Further, the colored layer 21K is configured to match the light absorption rate in the display unit 10 when no light is emitted. The light absorption rate indicates the rate at which external light entering an object, particularly visible light, is absorbed without being reflected. Here, the display unit 10 is configured to confine almost 100% of the external light entering the inside of the display unit 10. That is, the light absorption rate of the display unit 10 is set to about 100%.

The colored layer 21K is formed by applying a substance having a light absorption rate of about 100%, for example, a black pigment ink. The colored layer 21K may be formed so that the light absorption rate is about 100% by a method such as thin film deposition, sputtering, or film coating. Further, the colored layer 21K may have a color difference from the display unit 10 at the time of non-emission less than a preset threshold value. The color difference is a distance in an arbitrary color space such as RGB or LAB. The smaller the color difference, the more difficult it is to distinguish the boundary between the display unit 10 and the colored layer 21K when the light is not emitted.

As shown in FIGS. 2 and 3, the colored layer 21K covers an edge part 10E of the display unit 10 from the ray direction side. That is, the colored layer 21K is arranged so that a part of the colored layer 21K overlaps the display unit 10, and the edge part 21E of the colored layer 21K is located inside the display unit 10 with respect to the edge part 10E of the display unit 10.

The first adhesive member 22 and the base material 23 in the peripheral portion structure 20B are integrated with the configuration in the display portion structure 20A, and have the same configuration as the configuration in the display portion structure 20A. The second case portion 26B is separated from the first case portion 26A, and is laminated on the anti-ray direction side of the base material 23 via the third adhesive member 25B.

The second case portion 26B is made of the same material as the first case portion 26A. The first case portion 26A and the second case portion 26B may be integrally formed, and any material may be selected for each portion.

The lower portion structure 20C includes a first case portion 26A and a painted portion 27. The painted portion 27 is made of a material such as an arbitrary paint, and covers the first case portion 26A from below.

As shown in FIG. 1, the storage portion 50 is arranged further below the lower portion structure 20C so as to hide the lower portion structure 20C.

1-2. Effect

According to the embodiment described above, the following effects are achieved.

(1a) One aspect of the present disclosure is an organic EL display 1, which includes the display unit 10 and the colored layer 21K. The display unit 10 includes a large number of light emitting elements that emit light when electric current is passed through an organic substance, and is configured to display an image by emitting light generated by the large number of light emitting elements from the display surface. The colored layer 21K is arranged on the same surface as the display surface so as to surround the display unit 10, and is composed of a material having a light absorption rate that matches the light absorption rate of the display unit 10 when no light is emitted.

According to such a configuration, since the colored layer 21K is arranged on the same surface as the display surface, it is possible to suppress diffuse reflection of external light near the boundary between the display unit 10 and the colored layer 21K. Further, since the light absorption rate of the display unit 10 and the light absorption rate of the colored layer 21K match near the boundary between the display unit 10 and the colored layer 21K, this boundary can be made difficult to see. Therefore, the display unit 10 at the time of non-light emission can be easily assimilated into the colored layer 21K.

(1b) The organic EL display 1 of one aspect of the present disclosure is arranged in the vehicle interior of the vehicle, and the colored layer 21K constitutes a part of the interior in the vehicle interior.

According to such a configuration, since the colored layer 21K forms a part of the interior in the vehicle interior, the organic EL display 1 at the time of non-light emission can be assimilated into the interior.

(1c) In one aspect of the present disclosure, the colored layer 21K covers the edge part 10E of the display unit 10 from the ray direction side, with the direction in which light is emitted from the display surface as the light ray direction.

According to such a configuration, even when a member such as an electrode having a light absorption rate different from that of the display unit 10 is present around the display unit 10, since the colored layer 21K covers the edge part 10E of the display unit 10 from the ray direction side, it is possible to make it difficult to visually recognize the boundary between the display unit 10 and the colored layer 21K.

(1d) The organic EL display 1 of one aspect of the present disclosure further includes the covering member 21. The covering member 21 seamlessly covers the entire surface of the display unit 10 and at least a part of the colored layer 21K from the ray direction side, and is configured to transmit the light emitted from the display unit 10.

According to such a configuration, since the covering member 21 seamlessly covers the display unit 10 and the colored layer 21K from the ray direction side, the boundary between the display unit 10 and the colored layer 21K can be made more difficult to see.

(1e) In one aspect of the present disclosure, the covering member 21 is configured to be translucent.

According to such a configuration, since the covering member 21 is semitransparently configured, the amount of light reflected at the boundary between the display unit 10 and the colored layer 21K can be suppressed. Therefore, it is possible to make this boundary more difficult to see.

(1f) The organic EL display 1 of one aspect of the present disclosure further includes the base material 23 and the adhesive member 24. The base material 23 has a higher rigidity than the display unit 10 and is configured to transmit light emitted from the display unit 10. The adhesive member 24 adheres the base material 23 and the display unit 10. The organic EL display 1 is configured by laminating the base material 23, the adhesive member 25, and the display unit 10 in this order from the ray direction side.

According to such a configuration, the display unit 10 can be fixed to the base material 23 having a rigidity higher than that of the display unit 10 by using the adhesive member 24. Therefore, the display unit 10 can be brought into close contact with the base material 23 along the shape of the base material 23. As a result, the image displayed on the display unit 10 can be visually recognized by the user as if it were projected from the base material 23 or from the covering member 21 if the covering member 21 is present.

2. Other Embodiments

Although the embodiments of the present disclosure have been described above, the present disclosure is not limited to the embodiments described above, and various modifications can be made to implement the present disclosure.

(2a) In the above embodiment, an example in which the organic EL display 1 is mounted on a vehicle has been described, but the present disclosure is not limited to this configuration. For example, the organic EL display 1 may have the display unit 10 arranged on the wall surface, floor surface, ceiling surface, or the like of any budding.

(2b) In the above embodiment, the storage portion 50 is arranged below the lower portion structure 20C, but the present disclosure is not limited to this configuration. For example, any configuration such as an air conditioner, a controller for sound, a drink holder, and the like can be arranged below the lower portion structure 20C.

(2c) A plurality of functions of one element in the above embodiment may be implemented by a plurality of elements, or one function of one element may be implemented by a plurality of elements. Further, a plurality of functions of a plurality of elements may be implemented by one element, or one function implemented by a plurality of elements may be implemented by one element. A part of the configuration of the above embodiment may be omitted. At least a part of the configuration of the above embodiment may be added to or replaced with another configuration of the above embodiment.

(2d) In addition to the organic EL display 1 described above, the present disclosure can be realized in various forms such as a system having the organic EL display 1 as a component.

What is claimed is:

1. An organic electroluminescence display arranged in a passenger compartment of a vehicle, the organic electroluminescence display comprising:
    a display unit having a large number of light emitting elements that emit light when electric current is passed through an organic substance, and being configured to display an image by emitting light generated by the large number of light emitting elements from a display surface; and
    a peripheral member being arranged on a same surface as the display surface so as to surround the display unit, and being composed of a material having a light absorption rate that matches a light absorption rate of the display unit when no light is emitted, wherein
    the peripheral member constitutes a part of an interior in the passenger compartment.

2. The organic electroluminescence display according to claim 1, wherein
    the peripheral member constitutes an inner surface of the passenger compartment or a part of an interior decoration in the passenger compartment.

3. The organic electroluminescence display according to claim 1, wherein
    a direction in which light is emitted from the display surface is defined as a ray direction, and
    the peripheral member is configured to cover an edge portion of the display unit from the ray direction side.

4. The organic electroluminescence display according to claim 1, further comprising:
    a covering member configured to seamlessly cover an entire surface of the display unit and at least a part of the peripheral member from the ray direction side and transmit the light emitted from the display unit.

5. The organic electroluminescence display according to claim 4, wherein
    the covering member is translucent.

6. The organic electroluminescence display according to claim 1, further comprising;
    a base material having a higher rigidity than the display unit and configured to transmit light emitted from the display unit, and
    an adhesive member for adhering the base material and the display unit, wherein
    the base material, the adhesive member, and the display unit are laminated in this order from the ray direction side.

\* \* \* \* \*